United States Patent
Atanasov et al.

(10) Patent No.: US 12,148,734 B2
(45) Date of Patent: Nov. 19, 2024

(54) TRANSISTORS, MEMORY CELLS, AND ARRANGEMENTS THEREOF

(71) Applicant: Intel Corporation, Santa Clara, CA (US)

(72) Inventors: Sarah Atanasov, Beaverton, OR (US); Abhishek A. Sharma, Hillsboro, OR (US); Bernhard Sell, Portland, OR (US); Chieh-Jen Ku, Portland, OR (US); Elliot Tan, Portland, OR (US); Hui Jae Yoo, Hillsboro, OR (US); Noriyuki Sato, Hillsboro, OR (US); Travis W. Lajoie, Forest Grove, OR (US); Van H. Le, Beaverton, OR (US); Thoe Michaelos, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 781 days.

(21) Appl. No.: 17/117,350

(22) Filed: Dec. 10, 2020

(65) Prior Publication Data
US 2022/0189913 A1 Jun. 16, 2022

(51) Int. Cl.
| | |
|---|---|
| *H01L 25/065* | (2023.01) |
| *H10B 12/00* | (2023.01) |
| *H10B 10/00* | (2023.01) |
| *H10B 20/00* | (2023.01) |
| *H10B 41/20* | (2023.01) |
| *H10B 43/20* | (2023.01) |
| *H10B 63/00* | (2023.01) |

(52) U.S. Cl.
CPC ......... *H01L 25/0652* (2013.01); *H10B 12/31* (2023.02); *H10B 10/12* (2023.02); *H10B 20/27* (2023.02); *H10B 41/20* (2023.02); *H10B 43/20* (2023.02); *H10B 63/34* (2023.02)

(58) Field of Classification Search
CPC .................................................... H10B 12/0383
See application file for complete search history.

(56) References Cited

U.S. PATENT DOCUMENTS

| | | | | |
|---|---|---|---|---|
| 9,698,272 B1* | 7/2017 | Ikeda | ................ | H01L 29/78642 |
| 9,842,839 B1* | 12/2017 | Sills | ................... | H01L 29/7827 |
| 10,403,631 B1* | 9/2019 | Lu | ...................... | H01L 21/76829 |
| 2010/0052029 A1* | 3/2010 | Huang | ................ | H10B 12/053 |
| | | | | 257/E27.084 |
| 2015/0228659 A1 | 8/2015 | Vu et al. | | |

(Continued)

FOREIGN PATENT DOCUMENTS

CN 208923136 U 5/2019

OTHER PUBLICATIONS

U.S. Appl. No. 17/117,978, filed Dec. 10, 2020; 69 pages.

(Continued)

*Primary Examiner* — Eric A. Ward
(74) *Attorney, Agent, or Firm* — Akona IP PC

(57) ABSTRACT

Disclosed herein are transistors, memory cells, and arrangements thereof. For example, in some embodiments, an integrated circuit (IC) structure may include a plurality of transistors, wherein the transistors are distributed in a hexagonally packed arrangement. In another example, in some embodiments, an IC structure may include a memory cell including an axially symmetric transistor coupled to an axially symmetric capacitor, wherein the axis of the transistor is aligned with the axis of the capacitor.

20 Claims, 10 Drawing Sheets

(56) References Cited

U.S. PATENT DOCUMENTS

2015/0279842 A1* 10/2015 Komeda ................ H10B 12/09
                                                      257/532
2018/0061840 A1   3/2018  Sills
2018/0331029 A1  11/2018  Sukekawa
2019/0348540 A1  11/2019  Pillarisetty et al.
2020/0185385 A1*  6/2020  Juengling .............. H10B 12/50
2021/0202485 A1*  7/2021  Inaba .................... H10B 12/036
2021/0296556 A1*  9/2021  Hsu ....................... H01L 29/423
2022/0115376 A1*  4/2022  Kim ...................... H01L 29/7802
2022/0285350 A1   9/2022  Okajima et al.

OTHER PUBLICATIONS

European Extended Search Report issued in EP Application No. 21 19 5422.7 on Mar. 4, 2022; 8 pages.
European Extended Search Report issued in EP Application No. 21198370 on Mar. 24, 2022; 8 pages.

* cited by examiner

TRANSISTORS, MEMORY CELLS, AND ARRANGEMENTS THEREOF

BACKGROUND

Conventional transistors (e.g., planar transistors) are typically included in a device layer of an integrated circuit (IC) die. When such a transistor is included in a memory cell, complex patterning of lines and vias may route electrical signals between the transistor and a charge storage element (e.g., a capacitor) outside of the device layer.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
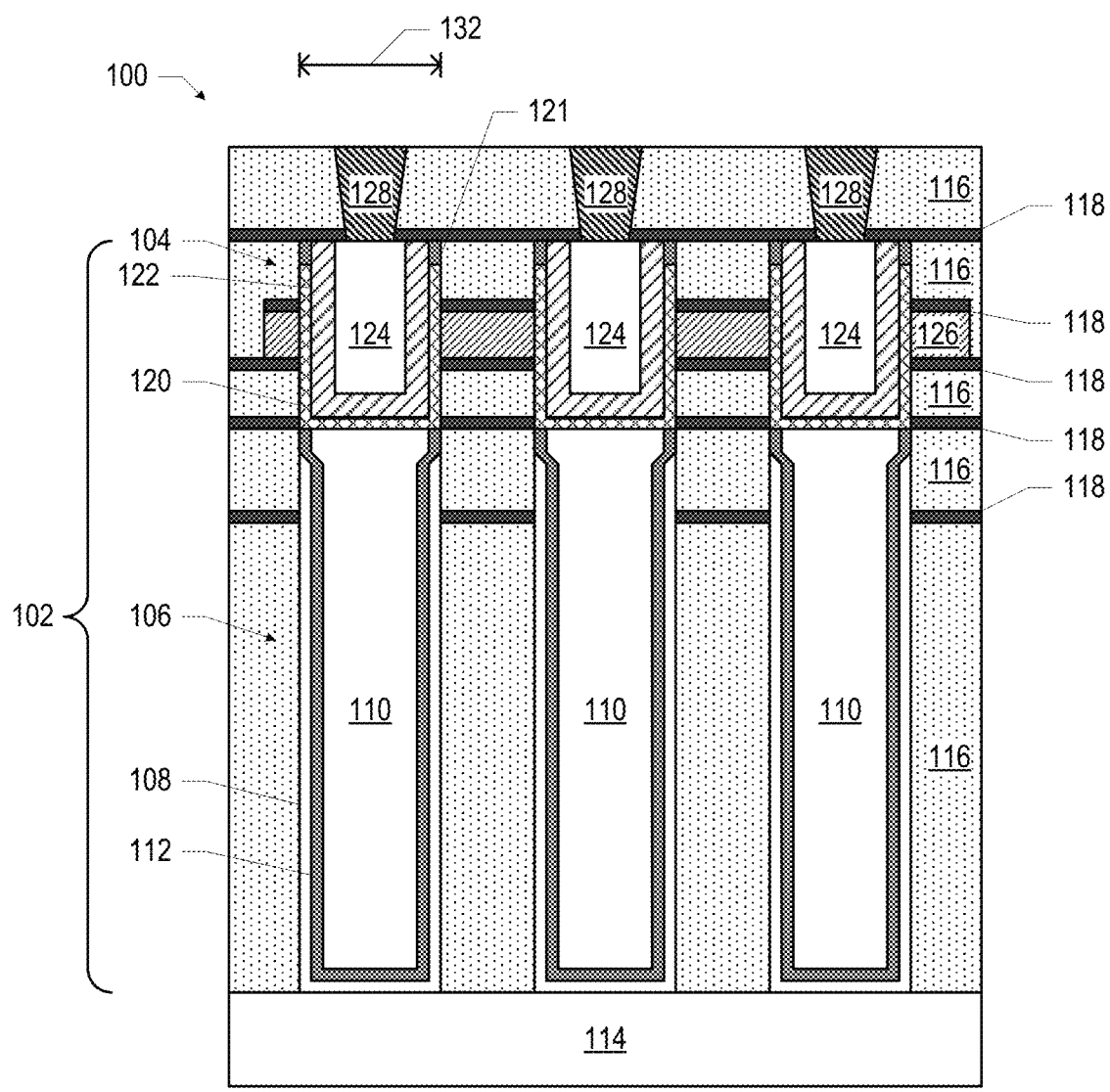
FIGS. 1-3 are side, cross-sectional views of integrated circuit (IC) structures including transistors and capacitors, in accordance with various embodiments.

Disclosed herein are transistors, memory cells, and arrangements thereof. For example, in some embodiments, an integrated circuit (IC) structure may include a plurality of transistors, wherein the transistors are distributed in a hexagonally packed arrangement. In another example, in some embodiments, an IC structure may include a memory cell including an axially symmetric transistor coupled to an axially symmetric capacitor, wherein the axis of the transistor is aligned with the axis of the capacitor.

Various ones of the embodiments disclosed herein may include gate-all-around (GAA) or channel-all-around (CAA) transistors that may be manufactured at back-end-of-line (BEOL) temperatures and conditions, enabling the integration of these transistors in new applications and settings. The GAA/CAA transistors disclosed herein may be in contact and aligned with an underlying capacitor as part of a memory cell, and may be readily fabricated. Various ones of the embodiments disclosed herein may include hexagonally packed arrangements of transistors that may allow for greater density than conventional rectangular arrangements. For example, memory cells arranged in accordance with the hexagonally packed arrangements disclosed herein may result in a greater memory density than conventional arrangements while preserving the space between cells required for adequate capacitance, and thus enhancing functionality and/or reducing cost per bit.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the subject matter disclosed herein. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrases "A and/or B" and "A or B" mean (A), (B), or (A and B). For the purposes of the present disclosure, the phrases "A, B, and/or C" and "A, B, or C" mean (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. As used herein, a "high-k dielectric" refers to a material having a higher dielectric constant than silicon oxide. As used herein, the term "conductive" means "electrically conductive" unless otherwise specified. As used herein, the term "material" may include one material or multiple materials having different material compositions.

Figure 2:
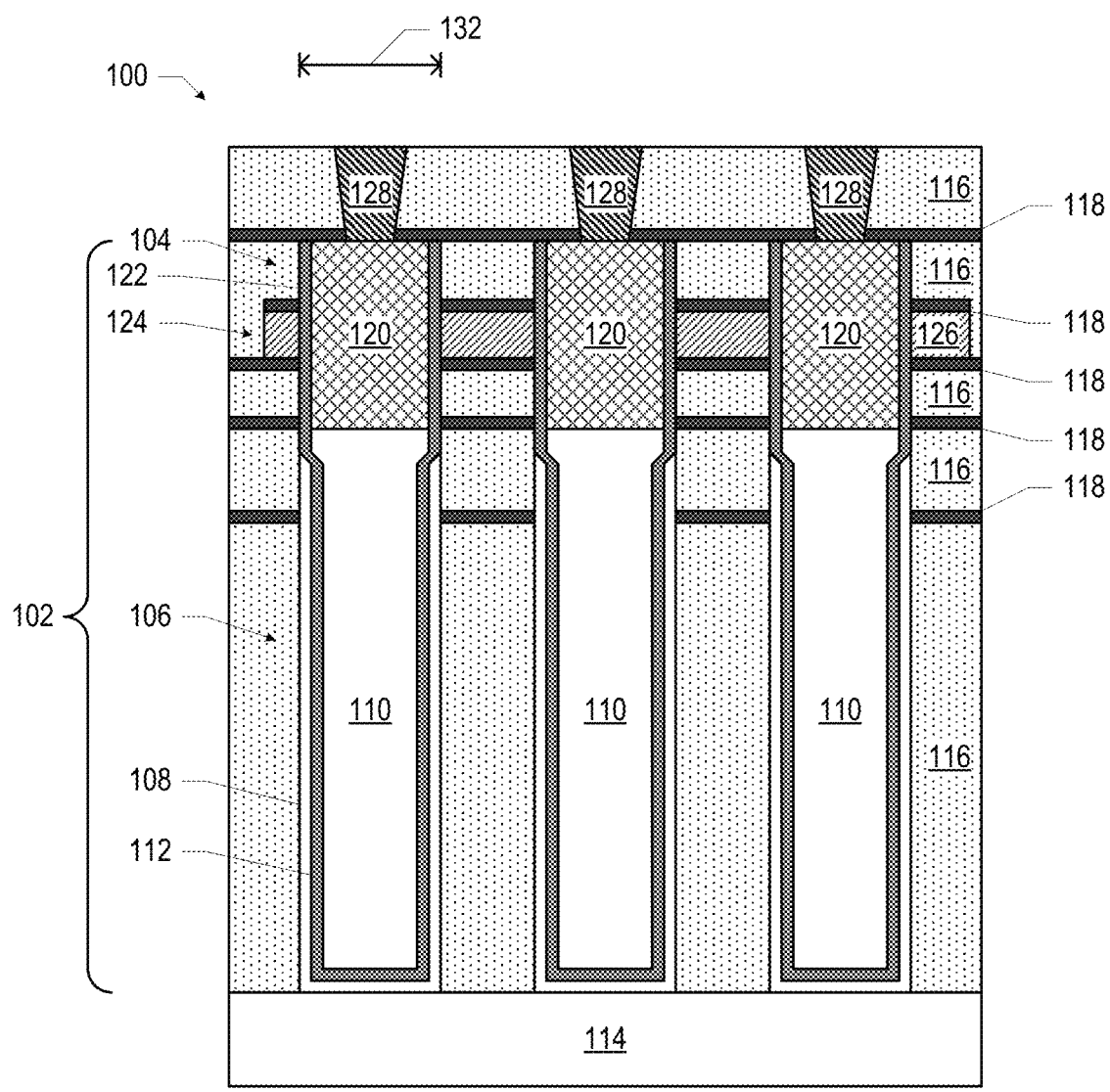
Figure 3:
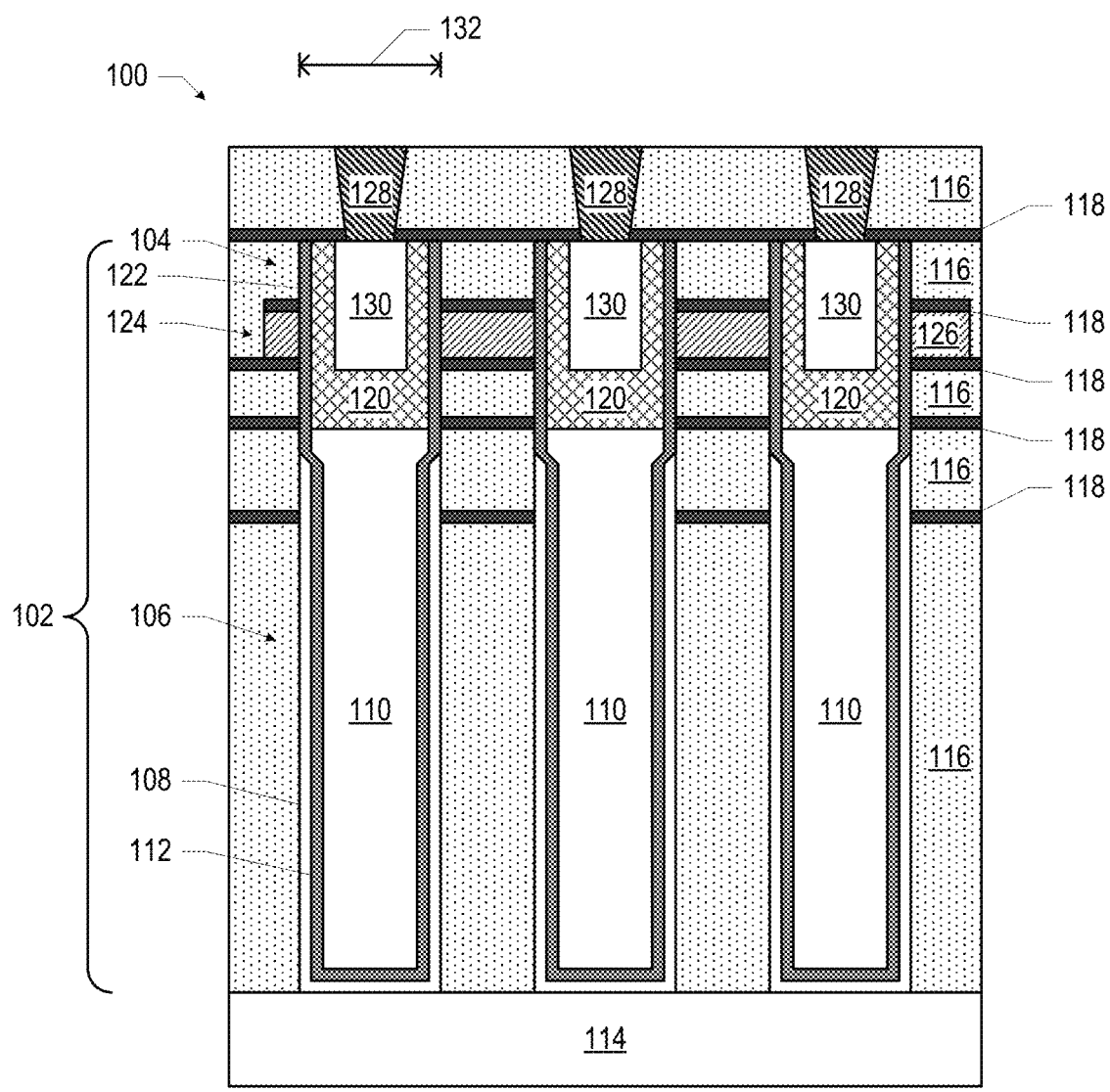

FIGS. 1-3 are side, cross-sectional views of IC structures 100 including transistors 104 and capacitors 106, in accordance with various embodiments. In the embodiments of FIGS. 1-3, the IC structures 100 include multiple memory cells 102, each including a transistor 104 electrically coupled to an associated capacitor 106. In some embodiments, the memory cells 102 may be one transistor-one capacitor (1T-1C) memory cells 102. The memory cells 102 may be disposed in a metallization stack of an IC die (e.g., the metallization stack 1619 of the IC device 1600 discussed below with reference to FIG. 15), and may be surrounded by layers of interlayer dielectric 116 spaced apart by liner materials 118, as shown. In a memory cell 102, the transistor 104 may be disposed above the capacitor 106. For example, an axis extending through the capacitor 106 and the transistor 104 of a memory cell 102 may be perpendicular to the planes of interlayer dielectric 116 and liner material 118. In some embodiments, the interface between a transistor 104 and a capacitor 106 of a memory cell 102 may be coplanar with a boundary between two adjacent layers of interlayer dielectric 116, as shown in FIGS. 1-3. The memory cells 102 may be disposed above a support structure 114, which may include any desired devices, interconnects, and materials (e.g., may include a substrate 1602, a device layer 1604, one or more layers of a metallization stack 1619, etc., as discussed below with reference to FIG. 15). In particular, the support structure 114 may include one or more interconnects to electrically contact the "lower" capacitor plate 108 of the capacitors 106. In some embodiments, the diameter 132 of the capacitors 106 (which may be equivalent to the diameter of the transistors 104 and the associated memory cells 102) may be less than 100 nanometers (e.g., less than 50 nanometers, or between 20 nanometers and 30 nanometers).

The transistors 104 and the capacitors 106 of the IC structures 100 of FIGS. 1-3 may be axially symmetric around a vertical axis. For example, FIG. 1 illustrates an embodiment in which a gate dielectric 122 is disposed around a central gate electrode 124, and a channel material 120 is disposed around the gate dielectric 122 (e.g., in a top, cross-sectional view, the gate dielectric 122 may form a ring around the gate electrode 124, and the channel material 120 may form a ring around the gate dielectric 122). The transistor 104 of FIG. 1 may thus be an example of a CAA transistor 104. A first memory control line 126 may be coplanar with the transistor 104, and may be in contact with the channel material 120 (e.g., in a top, cross-sectional view, the channel material 120 and the gate dielectric 122 may be between the gate electrode 124 and the first memory control line 126); in some embodiments, the first memory control line 126 of FIG. 1 may be a bit line. A second memory control line 128 (which may include, for example, a conductive via, as shown) may contact the gate electrode 124 such that the transistor 104 is between the second memory control line 128 and the capacitor 106; in some embodiments, the second memory control line 128 of FIG. 1 may be a word line. In some embodiments, the top surface of the channel material 120 may be recessed back from the top surface of the gate dielectric 122/gate electrode 124, and a dielectric material 121 may be present in the recess to reduce the risk of shorting between the second memory control line 128. In some other embodiments, the dielectric material 121 may not be present, and the use of a conductive via as part of the second memory control line 128 may be adequate to reduce the shorting risk, while in still other embodiments, the dielectric material 121 may be present and a conductive line of the second memory control line 128 may directly contact the gate electrode 124 (instead of contacting the gate electrode 124 through a conductive via).

FIG. 2 illustrates an embodiment in which a gate dielectric 122 is disposed around a central channel material 120 (e.g., in a top, cross-sectional view, the gate dielectric 122 may form a ring around the channel material 120), and the gate electrode 124 is provided by conductive material that also acts as a first memory control line 126 to couple the gate electrodes 124 of multiple transistors 104 across different memory cells 102. The transistors 104 of FIG. 2 may thus be an example of a GAA transistor 104. The first memory control line 126 of the IC structure 100 of FIG. 2 may be coplanar with the transistor 104, and may be in contact with the gate dielectric 122; in some embodiments, the first memory control line 126 of FIG. 2 may be a word line. A second memory control line 128 (which may include, for example, a conductive via, as shown) may contact the channel material 120 such that the transistor 104 is between the second memory control line 128 and the capacitor 106; in some embodiments, the second memory control line 128 of FIG. 2 may be a bit line. FIG. 3 illustrates an IC structure 100 sharing a number of features with the IC structure 100 of FIG. 2, but in which a contact metal 130 is centrally disposed in the channel material 120 such that, in a top, cross-sectional view, the channel material 120 may form a ring around the contact metal 130. In the embodiment of FIG. 3, the second memory control line 128 may contact the contact metal 130 (which may in turn contact the channel material 120); the contact metal 130 may be selected so as to achieve a reduced contact resistance between the second memory control line 128 and the channel material 120 of the transistor 104 of FIG. 3.

The capacitors 106 of the IC structures 100 of FIGS. 1-3 may include a capacitor plate 108 spaced apart from a capacitor plate 110 by a high-k dielectric 112. The capacitor plate 110 of a capacitor 106 in a memory cell 102 may be in contact with the channel material 120 of the transistor 104 of the memory cell 102, as shown. In some memory cells 102, the high-k dielectric 112 may be materially continuous with the gate dielectric 122 of the transistor 104 (e.g., formed during a single deposition step), as illustrated in FIGS. 2-3, while in other embodiments, the high-k dielectric 112 may not be materially continuous with the gate dielectric 122 of the transistor 104 (e.g., the high-k dielectric 112 may be formed during a different deposition step than the gate dielectric 122 and/or the high-k dielectric 112 may have a different material composition than the gate dielectric 122). As noted above, the capacitors 106 may be axially symmetric around the vertical axis; in a top, cross-sectional view, the high-k dielectric 112 may form a ring around the capacitor plate 110, and the capacitor plate 108 may form a ring around the high-k dielectric 112. As noted above, the support structure 114 may include one or more interconnects to electrically contact the "lower" capacitor plate 108 of the capacitors 106 to make desired electrical connections with the capacitors 106.

The IC structures 100 disclosed herein may include any suitable materials. In some embodiments, the channel material 120 may include semiconductor material systems including, for example, n-type or p-type materials systems. The channel material 120 may include a semiconductor material (e.g., an oxide semiconductor material). In some embodiments, the channel material 120 may include indium, gallium, zinc, and oxygen (e.g., in the form of indium gallium zinc oxide (IGZO)). In some embodiments, the channel material 120 may include tin and oxygen (e.g., in the form of tin oxide); antimony and oxygen (e.g., in the form of antimony oxide); indium and oxygen (e.g., in the form of indium oxide); indium, tin, and oxygen (e.g., in the form of indium tin oxide); titanium and oxygen (e.g., in the form of titanium oxide); zinc and oxygen (e.g., in the form of zinc oxide); indium, zinc, and oxygen (e.g., in the form of indium zinc oxide); gallium and oxygen (e.g., in the form of gallium oxide); titanium, oxygen, and nitrogen (e.g., in the form of titanium oxynitride); ruthenium and oxygen (e.g., in the form of ruthenium oxide); or tungsten and oxygen (e.g., in the form of tungsten oxide).

The gate electrode 124 may include at least one p-type work function metal or n-type work function metal, depending on whether the transistor 104 is to be included a p-type metal oxide semiconductor (PMOS) transistor or an n-type metal oxide semiconductor (NMOS) transistor. For a PMOS transistor, metals that may be used for the gate electrode 124 may include, but are not limited to, ruthenium, palladium, platinum, cobalt, nickel, and conductive metal oxides (e.g., ruthenium oxide). For an NMOS transistor, metals that may be used for the gate electrode 124 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 124 may consist of a stack of two or more metal layers, where one or more metal layers are work function metal layers and at least one metal layer is a fill metal layer. Further metal layers may be included for other purposes, such as to act as a barrier layer. The capacitor plates 108 and 110 may include, but are not limited to, titanium, tantalum, tungsten, aluminum, and nitrides of these and/or other conductive materials.

The gate dielectric 122 may be a high-k dielectric, and may include one or more layers of material. The gate dielectric 122 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 122 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. The high-k dielectric 112 of a capacitor 106 may take any of the forms of the gate dielectric 122 disclosed herein.

The interlayer dielectric 116 may include silicon and oxygen (e.g., in the form of silicon oxide); silicon and nitrogen (e.g., in the form of silicon nitride); aluminum and oxygen (e.g., in the form of aluminum oxide); and/or silicon, oxygen, and nitrogen (e.g., in the form of silicon oxynitride). The liner material 118 may include, for example, silicon, oxygen, and nitrogen (e.g., in the form of silicon nitride or silicon oxynitride), or other metal oxides such as aluminum oxide. The first memory control line 126 and the second memory control line 128 may include any suitable materials, such as tungsten, tantalum, copper, and/or other conductive materials.

FIGS. 1-3 illustrate portions of an IC structure 100 with three memory cells 102, but an IC structure 100 may include any desired number of memory cells 102 arranged in any desired manner. More generally, an IC structure 100 may include any desired number of transistors 104 arranged in any desired manner. For example, FIGS. 4-13 are top views of arrangements of transistors 104 in an IC structure 100, in accordance with various embodiments. The IC structures 100 of FIGS. 4-13 may include any of the transistors 104 disclosed herein; although various ones of FIGS. 4-13 illustrate first memory control lines 126 and second memory control lines 128 in the IC structures 100 therein, this is simply illustrative, and transistors 104 may be arranged as illustrated in FIGS. 4-13 without being part of a memory device. Although FIGS. 4-13 depict transistors 104 arranged in various ways, any of the capacitors 106 disclosed herein may be arranged as illustrated in FIGS. 4-13 (e.g., on their own, or as part of memory cells 102).

Figure 4:
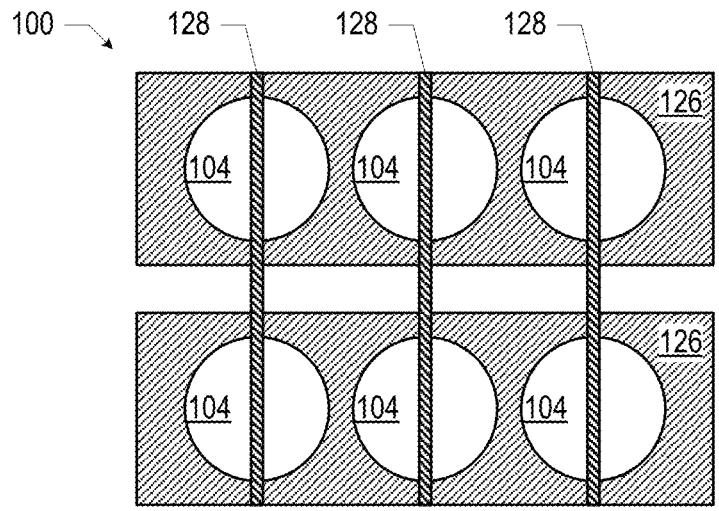
FIGS. 4-13 are top views of arrangements of transistors in an IC structure, in accordance with various embodiments.

In some embodiments, the transistors 104 (e.g., on their own, or as part of memory cells 102) may be arranged in a rectangular array when viewed from the "top." For example, FIG. 4 is a top view of an IC structure 100 having multiple transistors 104 arranged in a rectangular array; different rows of the transistors 104 may be coupled together by a first memory control line 126 (which may be, for example, a word line or a bit line, as discussed above with reference to FIGS. 1-3) and different columns of the transistors 104 may be coupled together by a second memory control line 128 (e.g., a word line or a bit line, as discussed above).

Figure 5:
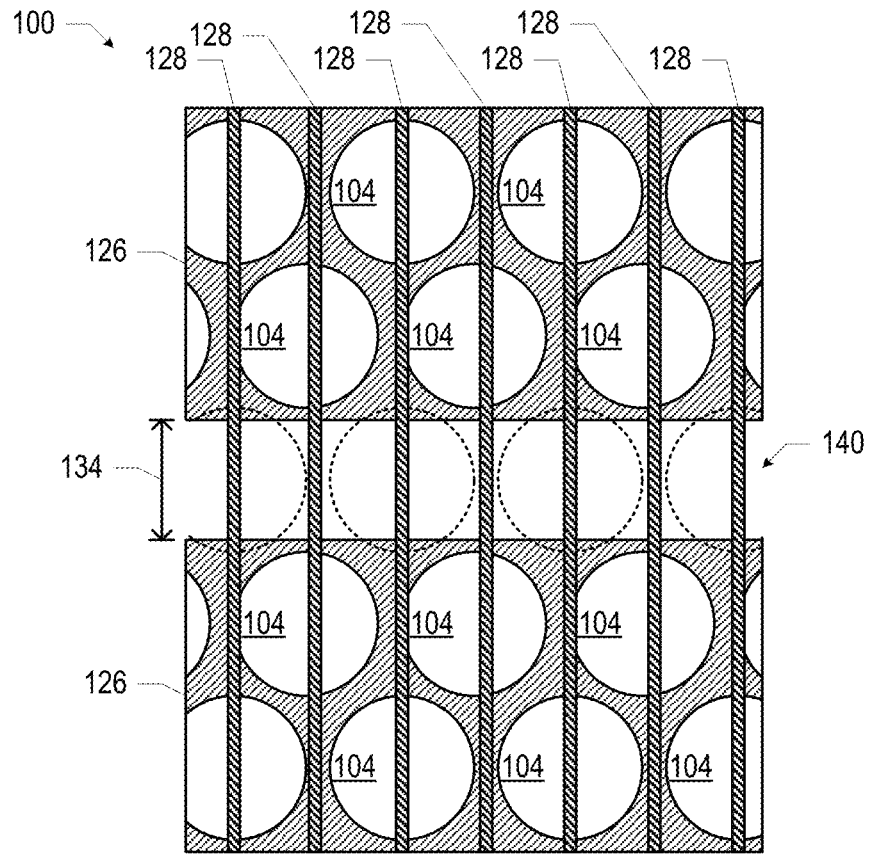

In other embodiments, an IC structure 100 may include non-rectangular arrangements of transistors 104. For example, the transistors 104 (e.g., on their own, or as part of memory cells 102) may be arranged in a hexagonally packed arrangement when viewed from the "top." FIGS. 5-8 are top views of hexagonally packed arrangements of transistors 104 in an IC structure 100, in accordance with various embodiments. In the embodiment of FIG. 5, the transistors 104 are hexagonally close-packed; rows of transistors 104 may be coupled together in pairs by a first memory control line 126 (which may be, for example, a word line or a bit line, as discussed above with reference to FIGS. 1-3) and different ones of the transistors 104 across different ones of the first memory control lines 126 may be coupled together by a second memory control line 128 (e.g., a word line or a bit line, as discussed above). The transistors 104 associated with one first memory control line 126 may be spaced apart from the transistors 104 associated with another first memory control line 126 by a spacer row 140 in the hexagonally close-packed arrangement of transistors 104; the spacer row 140 may represent a portion of the hexagonally close-packed arrangement that is "plugged" during lithography to avoid patterning transistors 104 in that area.

Figure 6:
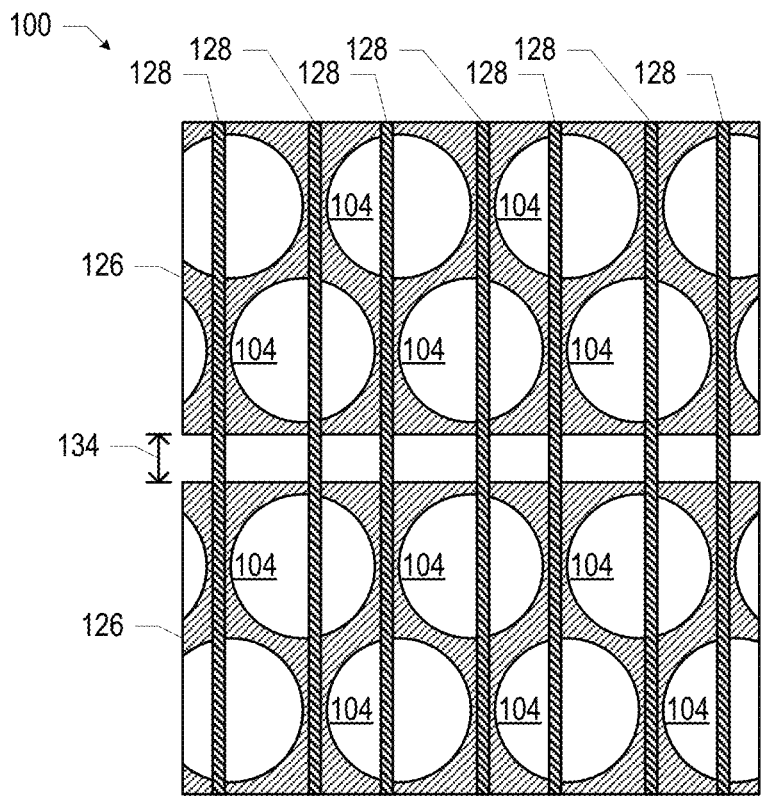

In the embodiment of FIG. 6, the transistors 104 are hexagonally close-packed in pairs of rows; rows of transistors 104 may be coupled together in pairs by a first memory control line 126 (which may be, for example, a word line or a bit line, as discussed above with reference to FIGS. 1-3) and different ones of the transistors 104 across different ones of the first memory control lines 126 may be coupled together by a second memory control line 128 (e.g., a word line or a bit line, as discussed above). In the IC structure 100 of FIG. 6, the transistors 104 associated with one first memory control line 126 may be spaced apart from the transistors 104 associated with another first memory control line 126 by a space that is smaller than the space required for a full spacer row 140 in a hexagonally close-packed arrangement (i.e., the distance 134 in the IC structure 100 of FIG. 6 is less than the distance 134 in the IC structure 100 of FIG. 5). Consequently, the arrangement of FIG. 6 may enable a greater number of rows of transistors 104 (associated with various first memory control lines 126) in a given area than an embodiment like that of FIG. 5.

Figure 7:
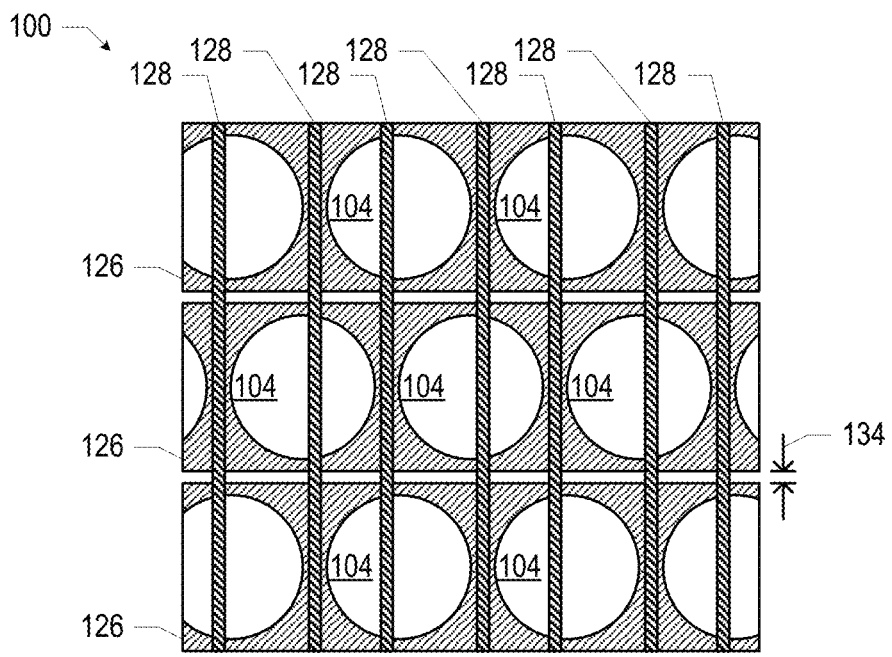

In the embodiment of FIG. 7, the transistors 104 are hexagonally arranged, but not hexagonally close-packed. In particular, the transistors 104 in a single row may be coupled together by a first memory control line 126 (which may be, for example, a word line or a bit line, as discussed above with reference to FIGS. 1-3) and different ones of the transistors 104 across different ones of the first memory control lines 126 may be coupled together by a second memory control line 128 (e.g., a word line or a bit line, as discussed above); in the embodiment of FIG. 7, the transistors 104 that are coupled by a common second memory control line 128 may "skip" rows, as shown. In the IC structure 100 of FIG. 7, the transistors 104 associated with one first memory control line 126 may be spaced apart from the transistors 104 associated with another first memory control line 126 by a space that is smaller than the space required for a full spacer row 140 in a hexagonally close-packed arrangement (i.e., the distance 134 in the IC structure 100 of FIG. 7 is less than the distance 134 in the IC structure 100 of FIG. 5).

Figure 8:
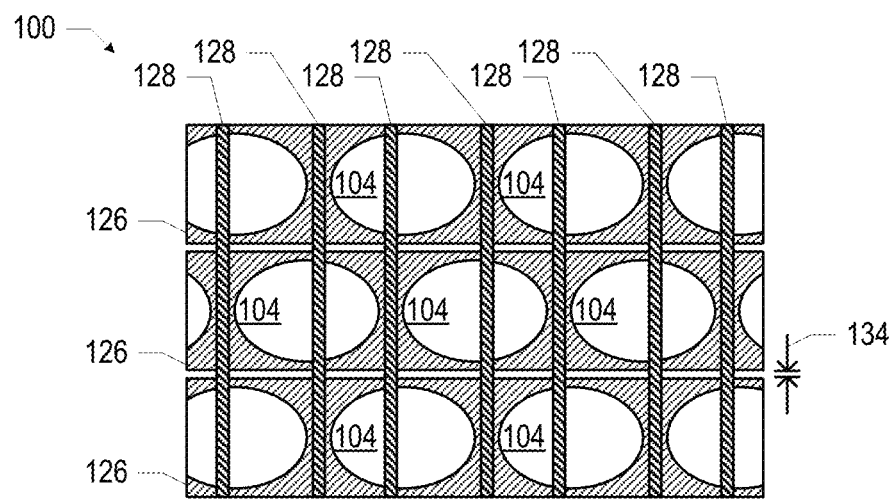
Figure 9:
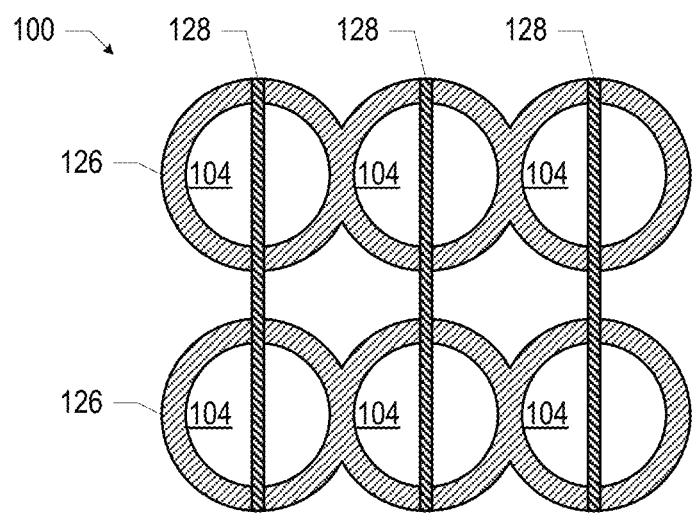
Figure 10:
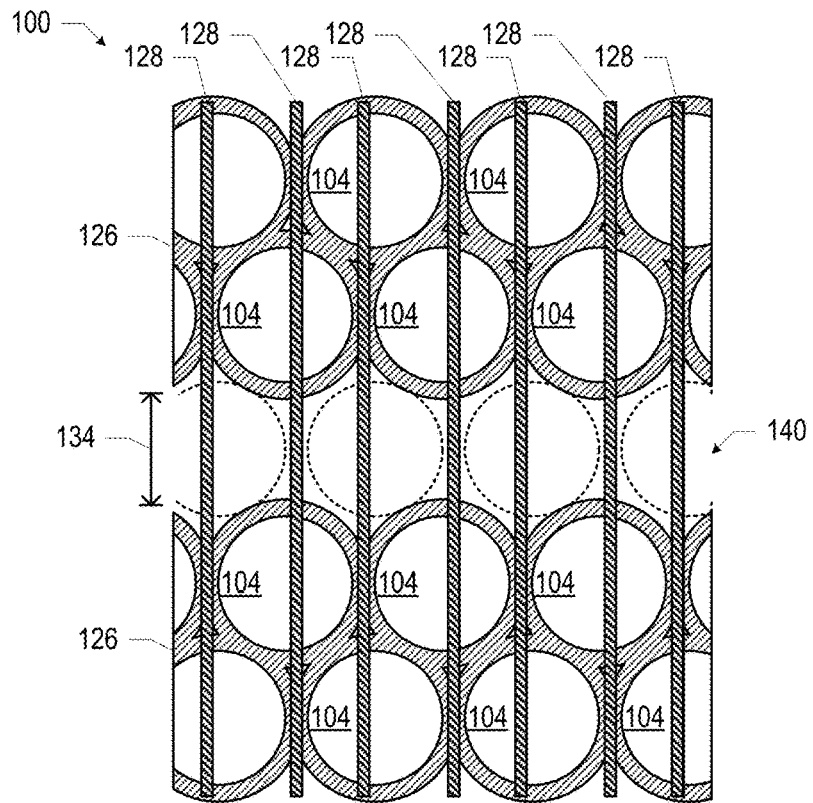
Figure 11:
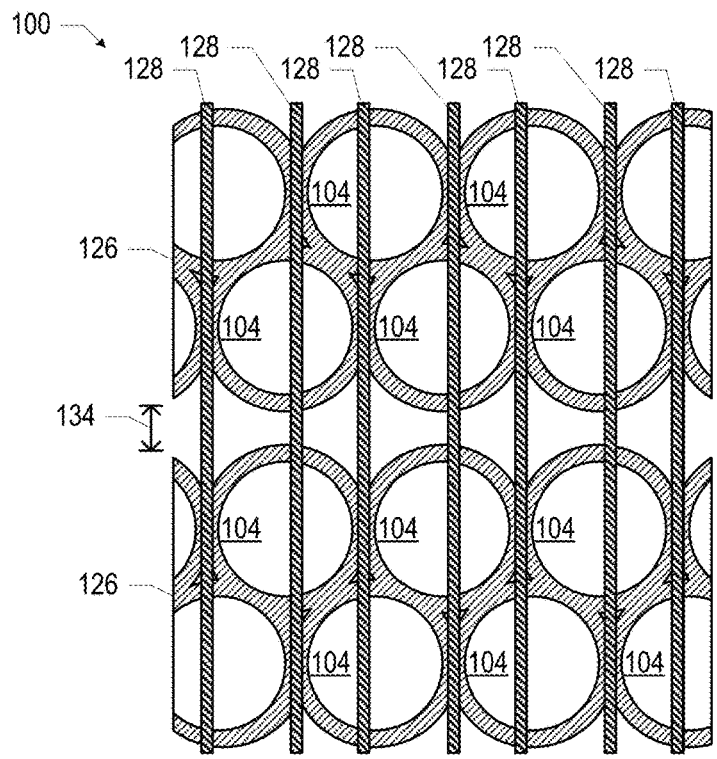
Figure 12:
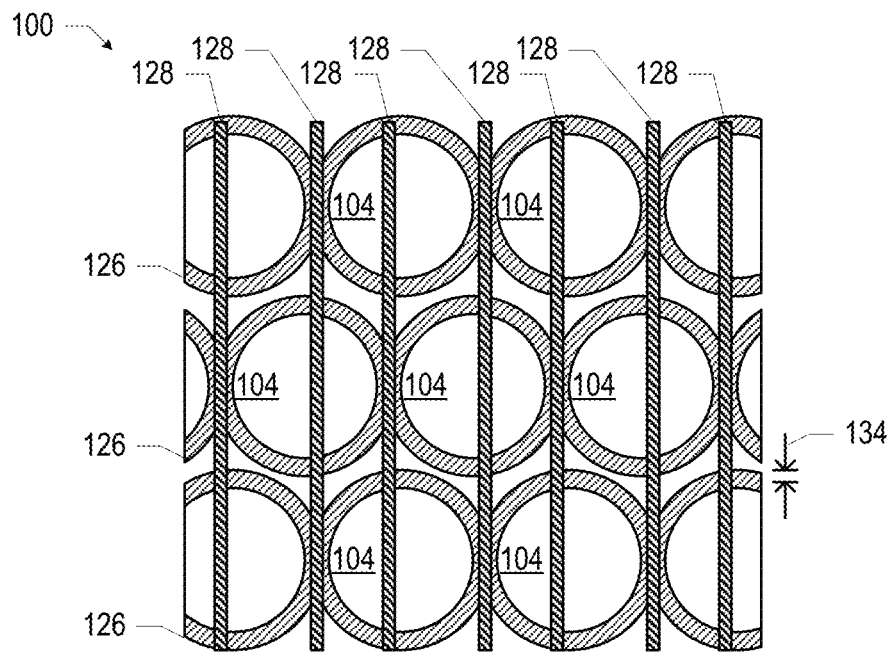
Figure 13:
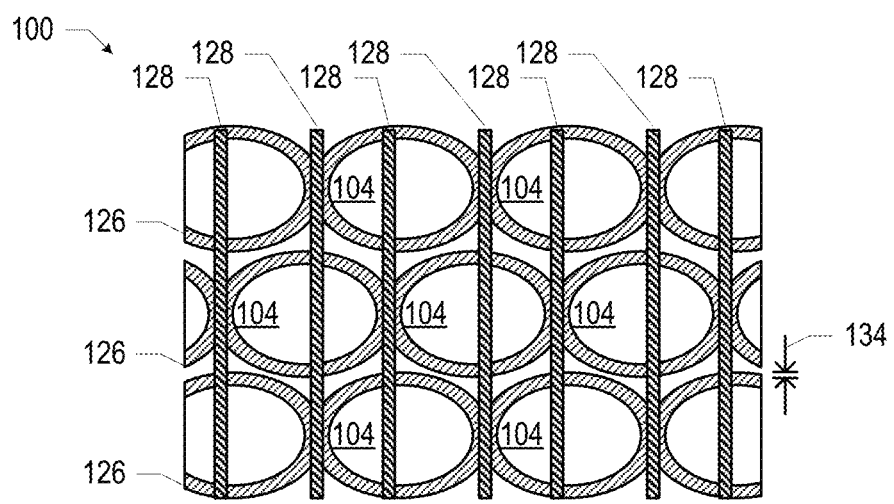

FIGS. 4-7 illustrate embodiments in which the footprint of the transistor 104 (e.g., the footprint of the channel material 120) is circular; in other embodiments, the footprint of the transistors 104 need not be circular. For example, FIG. 8 illustrates an IC structure 100 similar to that of FIG. 7, but in which the footprints of the transistors 104 are ovals. Such embodiments may allow for a greater number of rows of transistors 104 (associated with different first memory control lines 126) in a given area than an embodiment like that of FIG. 7.

In the embodiments of FIGS. 4-8, the first memory control lines 126 have largely rectangular footprints, but this need not be the case. For example, in some embodiments, the footprint of a first memory control line 126 may follow the footprint of the transistors 104 associated with that first memory control line 126. This may occur when, for example, a spacer process is used to pattern the material of the first memory control line 126 in an IC structure 100 such that the location of the material of the first memory control line 126 follows the location of the material of the transistors 104. FIGS. 9-13 illustrate IC structures 100 similar to the IC structures 100 of FIGS. 4-8, respectively, but in which the footprint of a first memory control line 126 follows the footprint of the transistors 104 associated with that first memory control line 126. For example, as illustrated in FIGS. 9-13, when the transistors 104 have circular or oval footprints, the first memory control line 126 may have a footprint that is the union of circles or ovals that are larger than the footprints of the transistors 104 (rather than having a footprint that is largely independent of the footprints of the transistors 104).

The IC structures 100 disclosed herein may be included in any suitable electronic component. FIGS. 14-18 illustrate various examples of apparatuses that may include any of the IC structures 100 disclosed herein.

Figure 14:
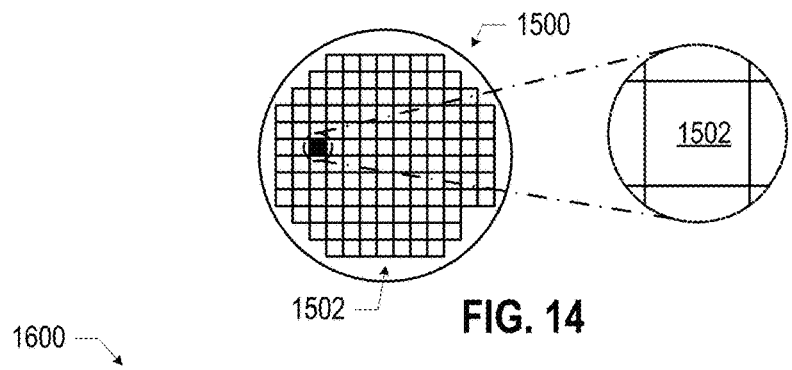
FIG. 14 is a top view of a wafer and dies that may include an IC structure in accordance with any of the embodiments disclosed herein.

FIG. 14 is a top view of a wafer 1500 and dies 1502 that may include one or more IC structures 100 in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more IC structures 100 (e.g., as discussed below with reference to FIG. 15), one or more transistors (e.g., some of the transistors 1640 of FIG. 15, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 18) or other logic that is configured to store information in the memory devices or execute instructions stored in the memory array.

Figure 15:
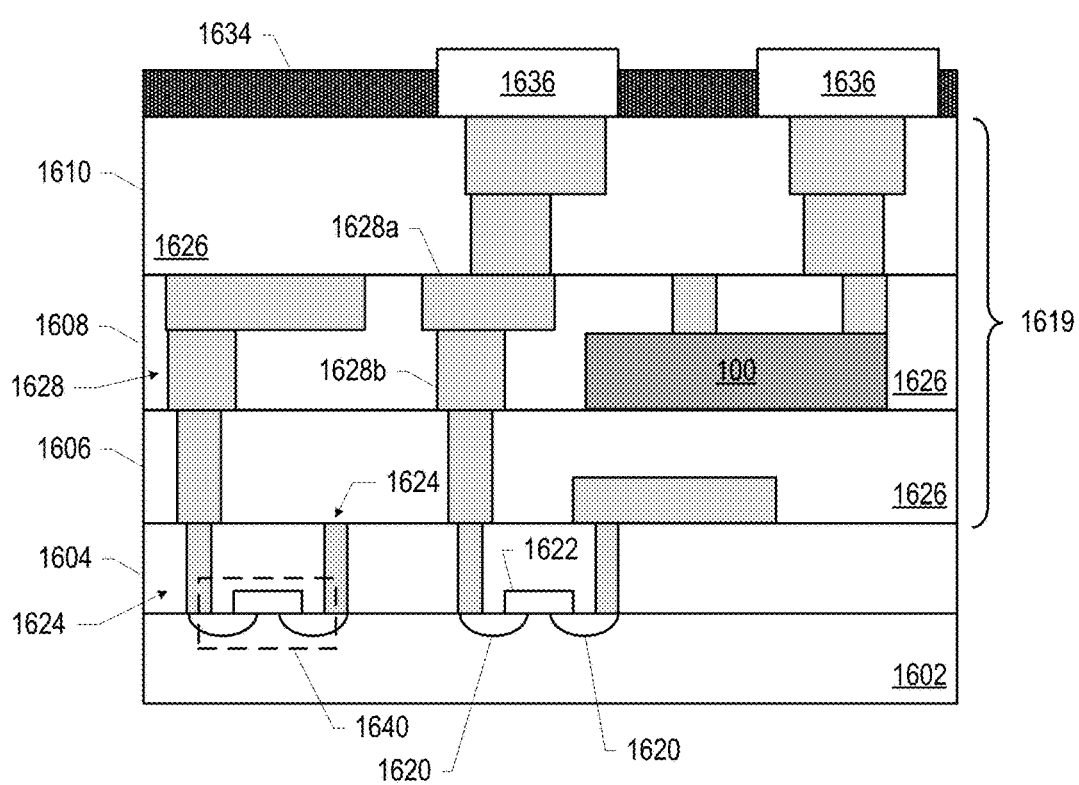
FIG. 15 is a side, cross-sectional view of an IC device that may include an IC structure in accordance with any of the embodiments disclosed herein.

FIG. 15 is a side, cross-sectional view of an IC device 1600 that may include one or more IC structures 100 in accordance with any of the embodiments disclosed herein. One or more of the IC devices 1600 may be included in one or more dies 1502 (FIG. 14). The IC device 1600 may be formed on a substrate 1602 (e.g., the wafer 1500 of FIG. 14) and may be included in a die (e.g., the die 1502 of FIG. 14). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 14) or a wafer (e.g., the wafer 1500 of FIG. 14).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 15 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a PMOS or an NMOS transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 15 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600. In some embodiments, one or more IC structures 100 may be disposed in one or more of the interconnect layers 1606-1610, in accordance with any of the techniques disclosed herein. FIG. 15 illustrates a single IC structure 100 in the interconnect layer 1608 for illustration purposes, but any number and arrangement of IC structures 100 may be included in any one or more of the layers in a metallization stack 1619. An IC structure 100 included in the metallization stack 1619 may be referred to as a "back-end" structure. One or more IC structures 100 in the metallization stack 1619 may be coupled to any suitable ones of the devices in the device layer 1604, and/or to one or more of the conductive contacts 1636 (discussed below). In an IC structure 100 including a memory cell 102, the capacitor 106 of the memory cell 102 may be between the transistor 104 of the memory cell 102 and the device layer 1604. In some embodiments, no device layer 1604 may be present.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 15). Although a particular number of interconnect layers 1606-1610 is depicted in FIG. 15, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 15. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 15. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer

1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 15, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 16:
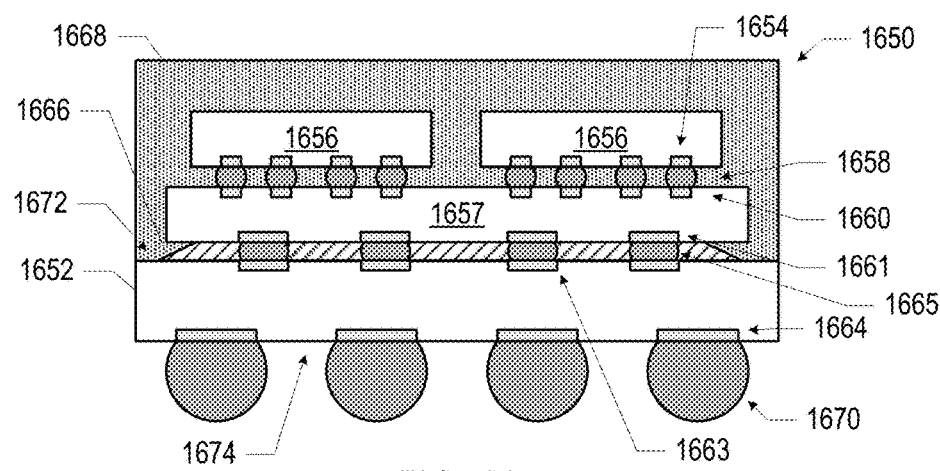
FIG. 16 is a side, cross-sectional view of an IC package that may include an IC structure in accordance with any of the embodiments disclosed herein.

FIG. 16 is a side, cross-sectional view of an example IC package 1650 that may include one or more IC structures 100 in accordance with any of the embodiments disclosed herein. In some embodiments, the IC package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may take the form of any of the interconnect structures 1628 discussed above with reference to FIG. 15.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 (or to other devices included in the package substrate 1652, not shown).

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 16 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., (e.g., a silicon bridge, an organic bridge, one or more waveguides, one or more interposers, wirebonds, etc.).

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 16 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 16 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 17.

The dies 1656 may take the form of any of the embodiments of the die 1502 discussed herein (e.g., may include any of the embodiments of the IC device 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory). In some embodiments, the die 1656 may include one or more IC structures 100 (e.g., as discussed above with reference to FIG. 14 and FIG. 15).

Although the IC package 1650 illustrated in FIG. 16 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 16, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 17:
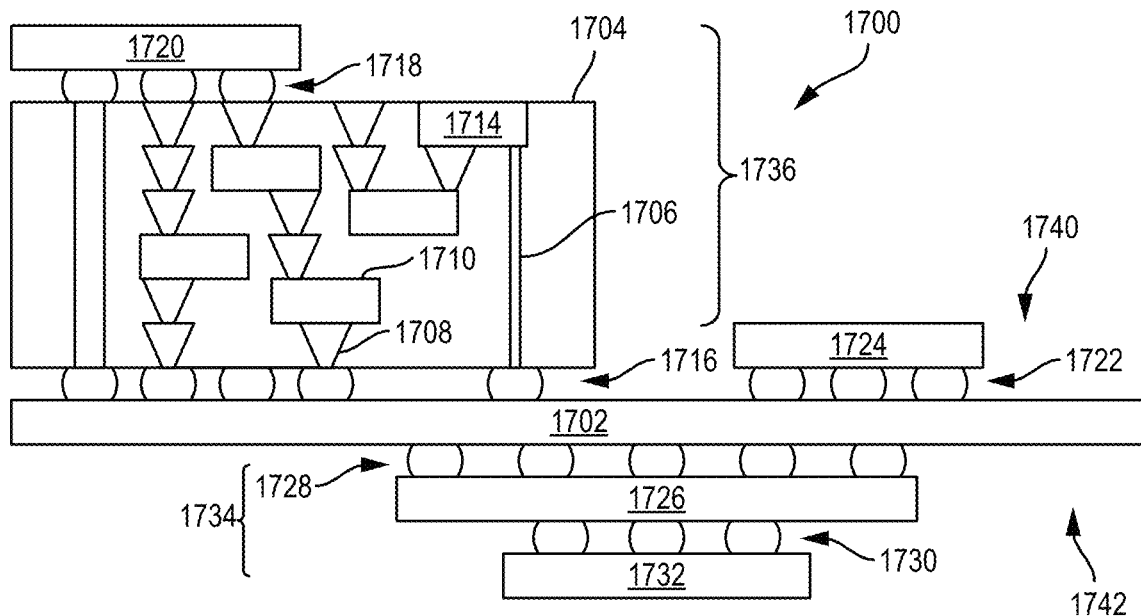
FIG. 17 is a side, cross-sectional view of an IC device assembly that may include an IC structure in accordance with any of the embodiments disclosed herein.

FIG. 17 is a side, cross-sectional view of an IC device assembly 1700 that may include one or more IC packages or other electronic components (e.g., a die) including one or more IC structures 100 in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 16 (e.g., may include one or more IC structures 100 in a die).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 17 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 17), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 17, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 14), an IC device (e.g., the IC device 1600 of FIG. 15), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 17, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 17 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 18:
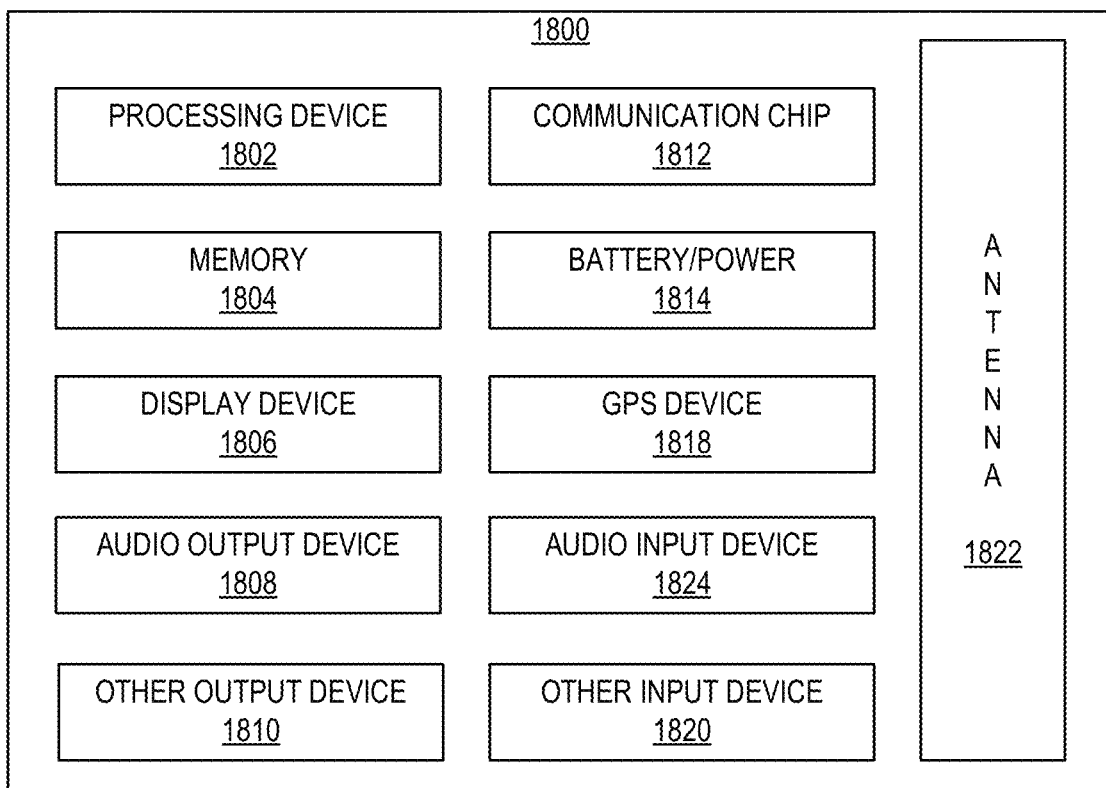
FIG. 18 is a block diagram of an example electrical device that may include an IC structure in accordance with any of the embodiments disclosed herein.

FIG. 18 is a block diagram of an example electrical device 1800 that may include one or more IC structures 100 in accordance with any of the embodiments disclosed herein. For example, any suitable ones of the components of the electrical device 1800 may include one or more of the IC device assemblies 1700, IC packages 1650, IC devices 1600, or dies 1502 disclosed herein. A number of components are illustrated in FIG. 18 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 18, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example A1 is an integrated circuit (IC) structure, including: a plurality of transistors, wherein the transistors are distributed in a hexagonally packed arrangement.

Example A2 includes the subject matter of Example A1, and further specifies that at least some of the plurality of transistors are in contact with a memory control line, and the memory control line is a bit line or a word line.

Example A3 includes the subject matter of Example A2, and further specifies that the plurality of transistors is a first plurality of transistors, the memory control line is a first memory control line, the IC structure includes a second plurality of transistors different from the first plurality of transistors, and the second plurality of transistors is in contact with a second memory control line different from the first memory control line.

Example A4 includes the subject matter of Example A3, and further specifies that the first plurality of transistors is hexagonally close-packed, and the second plurality of transistors is hexagonally close-packed.

Example A5 includes the subject matter of Example A3, and further specifies that the first plurality of transistors is not hexagonally close-packed, and the second plurality of transistors is not hexagonally close-packed.

Example A6 includes the subject matter of any of Examples A3-5, and further specifies that the first plurality of transistors is spaced apart from the second plurality of transistors by a spacer row in the hexagonally packed arrangement.

Example A7 includes the subject matter of Example A2, and further specifies that the plurality of transistors includes a first plurality of transistors and a second plurality of transistors different from the first plurality of transistors, the memory control line is a first memory control line, the first plurality of transistors is in contact with a first memory control line, and the second plurality of transistors is in contact with a second memory control line different from the first memory control line.

Example A8 includes the subject matter of Example A7, and further specifies that the plurality of transistors is hexagonally close-packed.

Example A9 includes the subject matter of Example A7, and further specifies that the plurality of transistors is not hexagonally close-packed.

Example A10 includes the subject matter of any of Examples A2-9, and further specifies that the memory control line is a bit line.

Example A11 includes the subject matter of any of Examples A2-9, and further specifies that the memory control line is a word line.

Example A12 includes the subject matter of any of Examples A2-11, and further specifies that the memory control line is a first memory control line, and the IC structure further includes: a second memory control line oriented perpendicular to the first memory control line and in contact with at least some of the plurality of transistors.

Example A13 includes the subject matter of Example A12, and further specifies that one of the first memory control line and the second memory control line is a bit line, and an other of the first memory control line and the second memory control line is a word line.

Example A14 includes the subject matter of any of Examples A12-13, and further specifies that the second memory control line is in contact with transistors in alternating rows of the hexagonally packed arrangement.

Example A15 includes the subject matter of any of Examples A2-14, and further specifies that the memory control line has a footprint that follows a footprint of at least some of the plurality of transistors.

Example A16 includes the subject matter of any of Examples A2-14, and further specifies that the memory control line has a rectangular footprint.

Example A17 includes the subject matter of any of Examples A1-16, and further specifies that individual ones of the transistors have a concentric structure.

Example A18 includes the subject matter of Example A17, and further specifies that individual ones of the transistors have a circular footprint.

Example A19 includes the subject matter of Example A17, and further specifies that individual ones of the transistors have an oval footprint.

Example A20 includes the subject matter of any of Examples A17-19, and further specifies that individual ones of the transistors include a gate dielectric around a central channel.

Example A21 includes the subject matter of any of Examples A17-19, and further specifies that individual ones of the transistors include a gate dielectric around a central gate electrode.

Example A22 includes the subject matter of Example A21, and further specifies that individual ones of the transistors include a channel around the gate dielectric.

Example A23 includes the subject matter of any of Examples A1-22, and further includes: a plurality of capacitors, wherein individual ones of the capacitors are coupled to individual ones of the transistors.

Example A24 includes the subject matter of Example A23, and further specifies that an individual transistor coupled to an individual capacitor is a one transistor-one capacitor memory cell.

Example A25 includes the subject matter of any of Examples A23-24, and further specifies that the plurality of capacitors are distributed in a same hexagonally packed arrangement as the plurality of transistors.

Example A26 includes the subject matter of any of Examples A1-25, and further specifies that the plurality of transistors are included in a metallization stack of a die.

Example A27 includes the subject matter of Example A26, and further specifies that the die includes a device layer and a set of conductive contacts, and the plurality of transistors is between the device layer and the set of conductive contacts.

Example A28 is an integrated circuit (IC) structure, including: a memory control line, wherein the memory control line is a bit line or a word line; and a plurality of transistors in contact with the memory control line, wherein the plurality of transistors are hexagonally close-packed.

Example A29 includes the subject matter of Example A28, and further specifies that the plurality of transistors includes at least two rows of transistors.

Example A30 includes the subject matter of any of Examples A28-29, and further specifies that the plurality of transistors is a first plurality of transistors, the memory control line is a first memory control line, the IC structure includes a second plurality of transistors different from the first plurality of transistors, and the second plurality of transistors is in contact with a second memory control line different from the first memory control line.

Example A31 includes the subject matter of Example A30, and further specifies that the second plurality of transistors is hexagonally close-packed.

Example A32 includes the subject matter of any of Examples A30-31, and further specifies that the second plurality of transistors includes at least two rows of transistors.

Example A33 includes the subject matter of any of Examples A30-32, and further specifies that the first plurality of transistors and the second plurality of transistors, taken together, are not hexagonally close-packed.

Example A34 includes the subject matter of any of Examples A30-32, and further specifies that the first plurality of transistors is spaced apart from the second plurality of transistors by a spacer row in a hexagonally close-packed arrangement.

Example A35 includes the subject matter of any of Examples A28-34, and further specifies that the memory control line is a bit line.

Example A36 includes the subject matter of any of Examples A28-34, and further specifies that the memory control line is a word line.

Example A37 includes the subject matter of any of Examples A28-36, and further specifies that the memory control line is a first memory control line, and the IC structure further includes: a second memory control line oriented perpendicular to the first memory control line and in contact with at least some of the plurality of transistors.

Example A38 includes the subject matter of Example A37, and further specifies that one of the first memory control line and the second memory control line is a bit line, and an other of the first memory control line and the second memory control line is a word line.

Example A39 includes the subject matter of any of Examples A28-38, and further specifies that the memory control line has a footprint that follows a footprint of at least some of the plurality of transistors.

Example A40 includes the subject matter of any of Examples A28-39, and further specifies that the memory control line has a rectangular footprint.

Example A41 includes the subject matter of any of Examples A28-40, and further specifies that individual ones of the transistors have a concentric structure.

Example A42 includes the subject matter of Example A41, and further specifies that individual ones of the transistors have a circular footprint.

Example A43 includes the subject matter of Example A41, and further specifies that individual ones of the transistors have an oval footprint.

Example A44 includes the subject matter of any of Examples A41-43, and further specifies that individual ones of the transistors include a gate dielectric around a central channel.

Example A45 includes the subject matter of any of Examples A41-43, and further specifies that individual ones of the transistors include a gate dielectric around a central gate electrode.

Example A46 includes the subject matter of Example A45, and further specifies that individual ones of the transistors include a channel around the gate dielectric.

Example A47 includes the subject matter of any of Examples A28-46, and further includes: a plurality of capacitors, wherein individual ones of the capacitors are coupled to individual ones of the transistors.

Example A48 includes the subject matter of Example A47, and further specifies that an individual transistor coupled to an individual capacitor is a one transistor-one capacitor memory cell.

Example A49 includes the subject matter of any of Examples A47-48, and further specifies that the plurality of capacitors are distributed in a same hexagonally packed arrangement as the plurality of transistors.

Example A50 includes the subject matter of any of Examples A28-49, and further specifies that the plurality of transistors are included in a metallization stack of a die.

Example A51 includes the subject matter of Example A50, and further specifies that the die includes a device layer and a set of conductive contacts, and the plurality of transistors is between the device layer and the set of conductive contacts.

Example A52 is an integrated circuit (IC) structure, including: a plurality of memory cells, wherein individual ones of the memory cells include at least one transistor, and the memory cells are distributed in a hexagonally packed arrangement.

Example A53 includes the subject matter of Example A52, and further specifies that at least some of the plurality of memory cells are in contact with a memory control line, and the memory control line is a bit line or a word line.

Example A54 includes the subject matter of Example A53, and further specifies that the plurality of memory cells is a first plurality of memory cells, the memory control line is a first memory control line, the IC structure includes a second plurality of memory cells different from the first plurality of memory cells, and the second plurality of memory cells is in contact with a second memory control line different from the first memory control line.

Example A55 includes the subject matter of Example A54, and further specifies that the first plurality of memory cells is hexagonally close-packed, and the second plurality of memory cells is hexagonally close-packed.

Example A56 includes the subject matter of Example A54, and further specifies that the first plurality of memory cells is not hexagonally close-packed, and the second plurality of memory cells is not hexagonally close-packed.

Example A57 includes the subject matter of any of Examples A54-56, and further specifies that the first plurality of memory cells is spaced apart from the second plurality of memory cells by a spacer row in the hexagonally packed arrangement.

Example A58 includes the subject matter of Example A53, and further specifies that the plurality of memory cells includes a first plurality of memory cells and a second plurality of memory cells different from the first plurality of memory cells, the memory control line is a first memory control line, the first plurality of memory cells is in contact with a first memory control line, and the second plurality of memory cells is in contact with a second memory control line different from the first memory control line.

Example A59 includes the subject matter of Example A58, and further specifies that the plurality of memory cells is hexagonally close-packed.

Example A60 includes the subject matter of Example A58, and further specifies that the plurality of memory cells is not hexagonally close-packed.

Example A61 includes the subject matter of any of Examples A53-60, and further specifies that the memory control line is a bit line.

Example A62 includes the subject matter of any of Examples A53-60, and further specifies that the memory control line is a word line.

Example A63 includes the subject matter of any of Examples A53-62, and further specifies that the memory control line is a first memory control line, and the IC structure further includes: a second memory control line oriented perpendicular to the first memory control line and in contact with at least some of the plurality of memory cells.

Example A64 includes the subject matter of Example A63, and further specifies that one of the first memory control line and the second memory control line is a bit line, and an other of the first memory control line and the second memory control line is a word line.

Example A65 includes the subject matter of any of Examples A63-64, and further specifies that the second memory control line is in contact with memory cells in alternating rows of the hexagonally packed arrangement.

Example A66 includes the subject matter of any of Examples A53-65, and further specifies that the memory control line has a footprint that follows a footprint of at least some of the plurality of memory cells.

Example A67 includes the subject matter of any of Examples A53-65, and further specifies that the memory control line has a rectangular footprint.

Example A68 includes the subject matter of any of Examples A52-67, and further specifies that individual ones of the transistors have a concentric structure.

Example A69 includes the subject matter of Example A68, and further specifies that individual ones of the transistors have a circular footprint.

Example A70 includes the subject matter of Example A68, and further specifies that individual ones of the transistors have an oval footprint.

Example A71 includes the subject matter of any of Examples A68-70, and further specifies that individual ones of the transistors include a gate dielectric around a central channel.

Example A72 includes the subject matter of any of Examples A68-70, and further specifies that individual ones of the transistors include a gate dielectric around a central gate electrode.

Example A73 includes the subject matter of Example A72, and further specifies that individual ones of the transistors include a channel around the gate dielectric.

Example A74 includes the subject matter of any of Examples A52-73, and further specifies that individual ones of the memory cells include at least one capacitor.

Example A75 includes the subject matter of any of Examples A52-74, and further specifies that the plurality of memory cells are included in a metallization stack of a die.

Example A76 includes the subject matter of Example A75, and further specifies that the die includes a device layer and a set of conductive contacts, and the plurality of memory cells is between the device layer and the set of conductive contacts.

Example A77 is an integrated circuit (IC) assembly, including: an IC die, wherein the IC die includes the IC structure of any of Examples A1-76; and a support coupled to the IC die.

Example A78 includes the subject matter of Example A77, and further specifies that the support includes a package substrate.

Example A79 includes the subject matter of any of Examples A77-78, and further specifies that the support includes a circuit board.

Example A80 includes the subject matter of Example A79, and further specifies that the circuit board is a motherboard.

Example A81 includes the subject matter of any of Examples A77-80, and further specifies that the support includes a housing.

Example A82 includes the subject matter of any of Examples A77-81, and further specifies that the IC assembly is a handheld computing device.

Example A83 includes the subject matter of any of Examples A77-81, and further specifies that the IC assembly is a server computing device.

Example A84 includes the subject matter of any of Examples A77-81, and further specifies that the IC assembly is a laptop computing device.

Example B1 is an integrated circuit (IC) structure, including: a memory cell including an axially symmetric transistor coupled to an axially symmetric capacitor, wherein the axis of the transistor is aligned with the axis of the capacitor.

Example B2 includes the subject matter of Example B1, and further specifies that the transistor is in contact with a plate of the capacitor.

Example B3 includes the subject matter of any of Examples B1-2, and further specifies that the capacitor includes a high-k dielectric material having a U-shaped cross-section.

Example B4 includes the subject matter of any of Examples B1-3, and further specifies that a gate of the transistor is in contact with a word line, and a channel of the transistor is in contact with a bit line.

Example B5 includes the subject matter of any of Examples B1-4, and further specifies that a gate dielectric of the transistor extends around a channel of the transistor.

Example B6 includes the subject matter of Example B5, and further specifies that the channel includes indium, gallium, zinc, and oxygen.

Example B7 includes the subject matter of any of Examples B5-6, and further specifies that a gate dielectric of the transistor is materially continuous with a high-k dielectric of the capacitor.

Example B8 includes the subject matter of any of Examples B5-7, and further specifies that the transistor includes a metal region, and the channel extends around the metal region.

Example B9 includes the subject matter of any of Examples B5-8, and further specifies that the channel is in contact with a plate of the capacitor.

Example B10 includes the subject matter of any of Examples B5-9, and further specifies that a footprint of a gate electrode of the transistor is outside a footprint of the capacitor.

Example B11 includes the subject matter of any of Examples B1-4, and further specifies that a gate dielectric of the transistor extends around a gate electrode of the transistor.

Example B12 includes the subject matter of Example B11, and further specifies that the gate dielectric has a U-shaped cross-section.

Example B13 includes the subject matter of any of Examples B11-12, and further specifies that a channel of the transistor has a U-shaped cross-section.

Example B14 includes the subject matter of any of Examples B1-13, and further specifies that a first memory control line is coplanar with the transistor, a second memory control line is arranged such that the transistor is between the second memory control line and the capacitor, one of the first memory control line and the second memory control line is a bit line, and an other of the first memory control line and the second memory control line is a word line.

Example B15 includes the subject matter of Example B14, and further specifies that a footprint of the first memory control line follows a footprint of a channel of the transistor.

Example B16 includes the subject matter of any of Examples B14-15, and further specifies that the first memory control line is oriented perpendicular to the second memory control line.

Example B17 includes the subject matter of any of Examples B1-16, and further specifies that an interface between the transistor and the capacitor is aligned with an interface between adjacent layers of an interlayer dielectric.

Example B18 includes the subject matter of any of Examples B1-17, and further specifies that the memory cell is one of a plurality of memory cells, and the plurality of memory cells are distributed in a hexagonally packed arrangement.

Example B19 includes the subject matter of Example B18, and further specifies that the plurality of memory cells are hexagonally close-packed.

Example B20 includes the subject matter of any of Examples B1-19, and further specifies that a footprint of the capacitor is a circle.

Example B21 includes the subject matter of any of Examples B1-19, and further specifies that a footprint of the capacitor is an oval.

Example B22 is an integrated circuit (IC) structure, including: a memory cell including a transistor coupled to a capacitor, wherein the capacitor is aligned with the transistor.

Example B23 includes the subject matter of Example B22, and further specifies that the transistor is in contact with a plate of the capacitor.

Example B24 includes the subject matter of any of Examples B22-23, and further specifies that the capacitor includes a high-k dielectric material having a U-shaped cross-section.

Example B25 includes the subject matter of any of Examples B22-24, and further specifies that a gate of the transistor is in contact with a word line, and a channel of the transistor is in contact with a bit line.

Example B26 includes the subject matter of any of Examples B22-25, and further specifies that a gate dielectric of the transistor extends around a channel of the transistor.

Example B27 includes the subject matter of Example B26, and further specifies that the channel includes indium, gallium, zinc, and oxygen.

Example B28 includes the subject matter of any of Examples B26-27, and further specifies that a gate dielectric of the transistor is materially continuous with a high-k dielectric of the capacitor.

Example B29 includes the subject matter of any of Examples B26-28, and further specifies that the transistor includes a metal region, and the channel extends around the metal region.

Example B30 includes the subject matter of any of Examples B26-29, and further specifies that the channel is in contact with a plate of the capacitor.

Example B31 includes the subject matter of any of Examples B26-30, and further specifies that a footprint of a gate electrode of the transistor is outside a footprint of the capacitor.

Example B32 includes the subject matter of any of Examples B22-25, and further specifies that a gate dielectric of the transistor extends around a gate electrode of the transistor.

Example B33 includes the subject matter of Example B32, and further specifies that the gate dielectric has a U-shaped cross-section.

Example B34 includes the subject matter of any of Examples B32-33, and further specifies that a channel of the transistor has a U-shaped cross-section.

Example B35 includes the subject matter of any of Examples B22-34, and further specifies that a first memory control line is coplanar with the transistor, a second memory control line is arranged such that the transistor is between the second memory control line and the capacitor, one of the first memory control line and the second memory control line is a bit line, and an other of the first memory control line and the second memory control line is a word line.

Example B36 includes the subject matter of Example B35, and further specifies that a footprint of the first memory control line follows a footprint of a channel of the transistor.

Example B37 includes the subject matter of any of Examples B35-36, and further specifies that the first memory control line is oriented perpendicular to the second memory control line.

Example B38 includes the subject matter of any of Examples B22-37, and further specifies that an interface between the transistor and the capacitor is aligned with an interface between adjacent layers of an interlayer dielectric.

Example B39 includes the subject matter of any of Examples B22-38, and further specifies that the memory cell is one of a plurality of memory cells, and the plurality of memory cells are distributed in a hexagonally packed arrangement.

Example B40 includes the subject matter of Example B39, and further specifies that the plurality of memory cells are hexagonally close-packed.

Example B41 includes the subject matter of any of Examples B22-40, and further specifies that a footprint of the capacitor is a circle.

Example B42 includes the subject matter of any of Examples B22-40, and further specifies that a footprint of the capacitor is an oval.

Example B43 is an integrated circuit (IC) structure, including: a memory cell including a transistor coupled to a capacitor, wherein a first memory control line is coplanar with the transistor, a second memory control line is arranged such that the transistor is between the second memory control line and the capacitor, one of the first memory control line and the second memory control line is a bit line, and an other of the first memory control line and the second memory control line is a word line.

Example B44 includes the subject matter of Example B43, and further specifies that the transistor is in contact with a plate of the capacitor.

Example B45 includes the subject matter of any of Examples B43-44, and further specifies that the capacitor includes a high-k dielectric material having a U-shaped cross-section.

Example B46 includes the subject matter of any of Examples B43-45, and further specifies that a gate of the transistor is in contact with a word line, and a channel of the transistor is in contact with a bit line.

Example B47 includes the subject matter of any of Examples B43-46, and further specifies that a gate dielectric of the transistor extends around a channel of the transistor.

Example B48 includes the subject matter of Example B47, and further specifies that the channel includes indium, gallium, zinc, and oxygen.

Example B49 includes the subject matter of any of Examples B47-48, and further specifies that a gate dielectric of the transistor is materially continuous with a high-k dielectric of the capacitor.

Example B50 includes the subject matter of any of Examples B47-49, and further specifies that the transistor includes a metal region, and the channel extends around the metal region.

Example B51 includes the subject matter of any of Examples B47-50, and further specifies that the channel is in contact with a plate of the capacitor.

Example B52 includes the subject matter of any of Examples B47-51, and further specifies that a footprint of a gate electrode of the transistor is outside a footprint of the capacitor.

Example B53 includes the subject matter of any of Examples B43-46, and further specifies that a gate dielectric of the transistor extends around a gate electrode of the transistor.

Example B54 includes the subject matter of Example B53, and further specifies that the gate dielectric has a U-shaped cross-section.

Example B55 includes the subject matter of any of Examples B53-54, and further specifies that a channel of the transistor has a U-shaped cross-section.

Example B56 includes the subject matter of any of Examples B43-55, and further specifies that a footprint of the first memory control line follows a footprint of a channel of the transistor.

Example B57 includes the subject matter of any of Examples B43-56, and further specifies that the first memory control line is oriented perpendicular to the second memory control line.

Example B58 includes the subject matter of any of Examples B43-57, and further specifies that an interface between the transistor and the capacitor is aligned with an interface between adjacent layers of an interlayer dielectric.

Example B59 includes the subject matter of any of Examples B43-58, and further specifies that the memory cell is one of a plurality of memory cells, and the plurality of memory cells are distributed in a hexagonally packed arrangement.

Example B60 includes the subject matter of Example B59, and further specifies that the plurality of memory cells are hexagonally close-packed.

Example B61 includes the subject matter of any of Examples B43-60, and further specifies that a footprint of the capacitor is a circle.

Example B62 includes the subject matter of any of Examples B43-60, and further specifies that a footprint of the capacitor is an oval.

Example B63 is an integrated circuit (IC) assembly, including: an IC die, wherein the IC die includes the IC structure of any of Examples B1-62; and a support coupled to the IC die.

Example B64 includes the subject matter of Example B63, and further specifies that the support includes a package substrate.

Example B65 includes the subject matter of any of Examples B63-64, and further specifies that the support includes a circuit board.

Example B66 includes the subject matter of Example B65, and further specifies that the circuit board is a motherboard.

Example B67 includes the subject matter of any of Examples B63-66, and further specifies that the support includes a housing.

Example B68 includes the subject matter of any of Examples B63-67, and further specifies that the IC assembly is a handheld computing device.

Example B69 includes the subject matter of any of Examples B63-67, and further specifies that the IC assembly is a server computing device.

Example B70 includes the subject matter of any of Examples B63-67, and further specifies that the IC assembly is a laptop computing device.

The invention claimed is:

1. An integrated circuit (IC) structure, comprising:
a plurality of memory cells distributed in a hexagonally packed arrangement, wherein an individual memory cell of the plurality of memory cells includes an axially symmetric transistor coupled to an axially symmetric capacitor, an axis of the transistor is aligned with an axis of the capacitor, a gate dielectric of the transistor extends around a channel of the transistor and is materially continuous with a dielectric material of the capacitor; and
a materially continuous layer of an electrically conductive material, wherein the materially continuous layer of the electrically conductive material surrounds channels of transistors of a first subset of the plurality of memory cells that are aligned along a first row and channels of transistors of a second subset of the plurality of memory cells that are aligned along a second row.

2. The IC structure of claim 1, wherein the transistor is coupled with a plate of the capacitor.

3. The IC structure of claim 1, wherein the dielectric material of the capacitor has a U-shaped cross-section.

4. The IC structure of claim 1, wherein a gate of the transistor is coupled with a word line, and the channel is coupled with a bit line.

5. The IC structure of claim 1, wherein the channel includes indium, gallium, zinc, and oxygen.

6. The IC structure of claim 1, wherein the transistor includes a metal region, and the channel extends around the metal region.

7. The IC structure of claim 1, wherein the channel is coupled with a plate of the capacitor.

8. The IC structure of claim 1, wherein a footprint of a gate electrode of the transistor is outside a footprint of the capacitor.

9. The IC structure of claim 1, wherein footprints of the transistors of the first subset of the plurality of memory cells and footprints of the transistors of a second subset of the plurality of memory cells are entirely within a footprint of the materially continuous layer of the electrically conductive material.

10. The IC structure of claim 1, wherein a footprint of the capacitor is an oval.

11. An integrated circuit (IC) structure, comprising:
a plurality of memory cells distributed in a hexagonally packed arrangement, wherein an individual memory cell of the plurality of memory cells includes a transistor coupled to a capacitor, the capacitor is aligned with the transistor, a gate dielectric of the transistor extends around a channel of the transistor, the transistor includes a metal region, and the channel extends around the metal region, and wherein the plurality of memory cells includes a first subset of memory cells having transistors aligned along a first row and further includes a second subset of memory cells having transistors aligned along a second row;
a first memory control line coplanar with the transistors aligned along the first row and the transistors aligned along the second row, wherein the first memory control line is a gate line for the transistors aligned along the first row and the transistors aligned along the second row; and
a second memory control line, wherein, in the individual memory cell, the transistor is between the second memory control line and the capacitor.

12. The IC structure of claim 11, wherein one of the first memory control line and the second memory control line is a bit line, and another one of the first memory control line and the second memory control line is a word line.

13. The IC structure of claim 12, wherein a footprint of the first memory control line follows a footprint of a channel of the transistor.

14. The IC structure of claim 12, wherein the first memory control line is oriented perpendicular to the second memory control line.

15. The IC structure of claim 11, wherein an interface between the transistor and the capacitor is aligned with an interface between adjacent layers of an interlayer dielectric.

16. The IC structure of claim 11, wherein the first memory control line includes a materially continuous layer of an electrically conductive material that surrounds channels of the transistors of the first subset of the plurality of memory cells and channels of the transistors of the second subset of the plurality of memory cells.

17. An integrated circuit (IC) structure, comprising:
a plurality of memory cells distributed in a hexagonally packed arrangement, wherein an individual memory cell of the plurality of memory cells includes an axially symmetric transistor coupled to an axially symmetric capacitor, an axis of the transistor is aligned with an axis of the capacitor, a gate dielectric of the transistor extends around a channel of the transistor, the transistor includes a metal region, and the channel extends around the metal region; and
a materially continuous layer of an electrically conductive material, wherein the materially continuous layer of the electrically conductive material surrounds channels of transistors of a first subset of the plurality of memory cells that are aligned along a first row and channels of transistors of a second subset of the plurality of memory cells that are aligned along a second row.

18. The IC structure of claim 17, wherein the gate dielectric of the transistor is materially continuous with a dielectric material of the capacitor.

19. The IC structure of claim 17, wherein a footprint of a gate electrode of the transistor is outside a footprint of the capacitor.

20. The IC structure of claim 17, wherein a footprint of the capacitor is an oval.

* * * * *